United States Patent [19]
Ternullo, Jr. et al.

[11] Patent Number: 6,052,328
[45] Date of Patent: Apr. 18, 2000

[54] HIGH-SPEED SYNCHRONOUS WRITE CONTROL SCHEME

[75] Inventors: Luigi Ternullo, Jr.; Michael C. Stephens, Jr., both of San Jose, Calif.

[73] Assignee: Vanguard International Semiconductor Corporation, Hsinchu, Taiwan

[21] Appl. No.: 08/995,379

[22] Filed: Dec. 22, 1997

[51] Int. Cl.[7] .................................................. G11C 8/00
[52] U.S. Cl. .................... 365/233; 365/189.05; 365/202; 365/190
[58] Field of Search .............................. 365/233, 189.05, 365/202, 190

[56] References Cited

U.S. PATENT DOCUMENTS

| 5,598,376 | 1/1997 | Merritt et al. | 365/230.06 |
| 5,886,947 | 3/1999 | Lee | 365/233 |

Primary Examiner—Andrew Q. Tran
Attorney, Agent, or Firm—Christensen O'Connor Johnson Kindness PLLC

[57] ABSTRACT

The present invention provides a method and apparatus that accomplishes a high performance, random read/write SDRAM design by synchronizing the read and write operations at the data line sense amplifier. This enables the design to perform random read and write operations without varying cycle time issues or unbalanced margin issues. The data lines are used as bi-directional lines to accomplish high performance reads and writes with minimal additional wiring overhead required. During a read operation, read data is transferred from the memory cells of the device across a series of consecutive pairs of data lines to an input/output port of the memory device. The first pair of data lines is coupled to a data line sense amplifier. The additional pairs of data lines are coupled to additional amplifiers. During a read operation, data is transferred across the consecutive pairs of data lines according to the timing cycles of the respective amplifiers. In order to quickly drive the data signals during a write operation up the series of consecutive pairs of data lines, the timing signals for each of the pairs of data lines except the first pair of data lines are disabled so that the data lines are allowed to float, and then the data lines are overdriven with the write data so that the write data quickly transitions up the series of data lines to the selected data line sense amplifier, where it arrives at approximately the same time that read data normally arrives during the timing cycle for the data line sense amplifier.

26 Claims, 12 Drawing Sheets

HIGH-SPEED SYNCHRONOUS WRITE CONTROL SCHEME

FIELD OF THE INVENTION

This invention relates generally to semiconductor memory devices with a matrix of memory cells from which data is read from or written to through pairs of data lines and, more particularly, to a method and apparatus for accomplishing a high performance write process without impacting the critical read path and accommodating random write and read cases that will not limit cycle time.

BACKGROUND OF THE INVENTION

In semiconductor memory devices that have a matrix of memory cells, data is usually carried to and from the memory cells by pairs of data lines. During a read process, data is read from the memory cells through the data lines and a series of components to the output of the memory device. During a write process, data is transferred from the input of the semiconductor memory device through the data lines and the series of components to the memory cells.

An exemplary semiconductor memory device that shows read and write processes is shown in U.S. Pat. No. 5,598,376, to Merritt et al. Merritt et al. discloses distributed write data drivers for burst access memories. With reference to FIG. 4 of Merritt et al., data written to the memory device is received on data I/O pad 100. The write data is passed through input circuit 102 to a global sense amp 66 over write data lines 103. The sense amplifier includes an I/O line multiplexer 104 which is used to select a path from local I/O data line pair 106 to one of two pairs of array I/O lines 108 and 110. I/O lines 108 are coupled to an adjacent section of the array (not shown). Array I/O lines 110 are true and complement lines coupled to a local array sense amplifier 112 which is part of array section 64. Column select signal 114 from column driver 115 couples array data I/O lines 110 to a pair of complementary lines 116 inside the local sense amplifier 112. Read data follows the same path from the memory cell to the global sense amp 66, where it is then driven on complementary data read lines 122 to complementary data lines 126 under control of data path control logic 124 and timing circuits 59. Data is driven to I/O pad 100 through output circuit 128.

Thus, Merritt et al. uses different sets of lines for its read and write operations. As described above, write data is passed to the global sense amp 66 over write data lines 103, which is different than the path of the read data from the global sense amp which travels over complementary read data lines 122 and 126. This is a common prior art method that uses different physical lines for the write and read data paths. A distinct disadvantage of this method relative to a method using the same data lines for both read and write processes is that it requires more control circuitry and more wiring, and thus consequently requires more area.

FIG. 2 of Merritt et al. illustrates some timing diagrams for a circuit such as that shown in FIG. 4. Specifically, FIG. 2 illustrates timing diagrams for performing a burst read followed by a burst write. As shown in FIG. 2, when the CAS signal is low the WE signal is high, a burst read access is started. On the second following edge of the CAS signal, the internal address generation circuitry provide a column address, and another access of the array begins. The first data out is driven from the device following the second CAS signal. Additional burst access cycles continue, for a device with a specified burst length of four, until the fifth following edge of CAS which latches a new column address for a new burst read access. The WE signal following in the fifth CAS cycle terminates the burst access, and initializes the device for additional burst accesses. The sixth following edge of CAS when the WE signal is low is used to latch a new burst address, latch input data, and begin a burst write access of the device. Additional data values are latched on successive CAS following edges until the RAS signal rises to terminate the burst access.

As illustrated in the timing diagrams of FIG. 2, Merritt et al. uses a burst access process for both read and write operations. This is done to achieve a faster, random access memory circuit. However, while this method of Merritt et al. works well in a system where the read and write operations are performed using different data lines, it does not address the problem of how to do faster reads and writes in a system that uses the same lines for both read and write operations. In particular, the timing diagrams of FIG. 2 do not address the problem of how to quickly transmit write data over lines that are controlled by read timing cycles. In systems which use the same lines for read and write operations, this problem must be addressed in order for the read and write operations to be performed. One prior art method for addressing this problem is to disable all the timing clocks that were used for the read process when a write process is to be performed. A disadvantage of this method is that then the write timing is not related to the read timing in any way and thus under certain conditions the write or read processes may break, and random reads or writes will not be possible at faster speeds.

The present invention is directed to providing a memory device that overcomes the foregoing and other disadvantages. More specifically, the present invention is directed to a memory device for performing a write operation within the same clock timing as the read.

SUMMARY OF THE INVENTION

A semiconductor memory device having pairs of data lines for reading and writing data signals to and from a matrix of memory cells is disclosed. The memory device includes a novel SDRAM architecture for performing a write operation within the same clock timing as the read at the data line sense amplifier.

A semiconductor memory device includes an input/output port for writing and reading data signals to and from the semiconductor memory device. Also included are consecutive pairs of data lines in sequence coupled between various sense amplifiers for passing data signals between the memory cells of the device and the input/output port of the device. Timing circuitry is also coupled to the data lines for controlling the timing of the passing of data signals to and from the data lines.

According to one aspect of the invention, the same pair of data lines that are used during a read operation to pass data signals from the memory cells to the input/output port are also used during a write operation to pass data signals from the input/output port to the memory cells. To accomplish this in a synchronous manner during a write operation the timing signal for the sense amplifier that is located closest to the memory cells is maintained in its normal operation, while the timing signals for the remaining sense amplifiers and equalization circuitry are disabled so that the remaining data lines may be overdriven with the write data as quickly as possible so as to transition it to the first sense amplifier within about the same period of time that data would have arrived from the memory cells during a read operation. In this manner, regardless of whether a read or a write operation is being performed at the first sense amplifier, read or write data arrives at approximately the same time during the given timing cycle so that the cycle can be completed within approximately the same time so that random read or write operations may be performed in a synchronous manner.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present device is directed to a circuit for a semiconductor memory in which data signals are stored in memory cells. Data signals may be read out from or written into the general semiconductor memory device from an input/output pad. Between the memory cells of the device and the input/output pad there exists several pairs of data lines and components for transitioning the data across the memory device. It takes a certain amount of time for the data to transition across a series of data lines and components that exist between the memory cells and the input/output pad of the device. Thus, while the first data line sense amplifier may acquire the data from the memory cells and perform its amplification process relatively quickly, it usually takes several timing cycles to then transition the data across the remaining sense amplifiers and data lines to the input/output pad of the device. Thus, if a write operation was merely performed as the reverse of a read operation, it would take several timing cycles to transition the write data from the input/output pad to the memory cells of the device. For reasons that will be described below, it is desirable for the data during a write operation to arrive at the first data line sense amplifier at the same time that data from a read operation arrives. When this is done, consecutive read and write timing cycles at the data line sense amplifier are made to be of the same length and therefore random read and write operations can be performed interchangeably in a system that is synchronized at the data line sense amplifier.

More specifically, as will be described below in more detail with respect to FIG. 1, the data line sense amplifier 32 is able to relatively quickly acquire data during a read operation due to its close proximity to the memory cells and the amplifiers 10–18. However, during a write operation, the data must transfer from the input/output pad 42 through the output sense amplifier 40, through the data lines IO1 and IO2, through the data line latch sense amplifier 36, and finally, through the data latch lines DLL1 and DLL2 in order to reach the data line sense amplifier 32. In order to quickly transition the data during a write operation through this series of components so that it arrives at the data line sense amplifier at the same time that data would have arrived during a read operation, all of the timing cycles of the components after the first data line sense amplifier 32 are disabled so that they may be overdriven with the write data.

Figure 2:
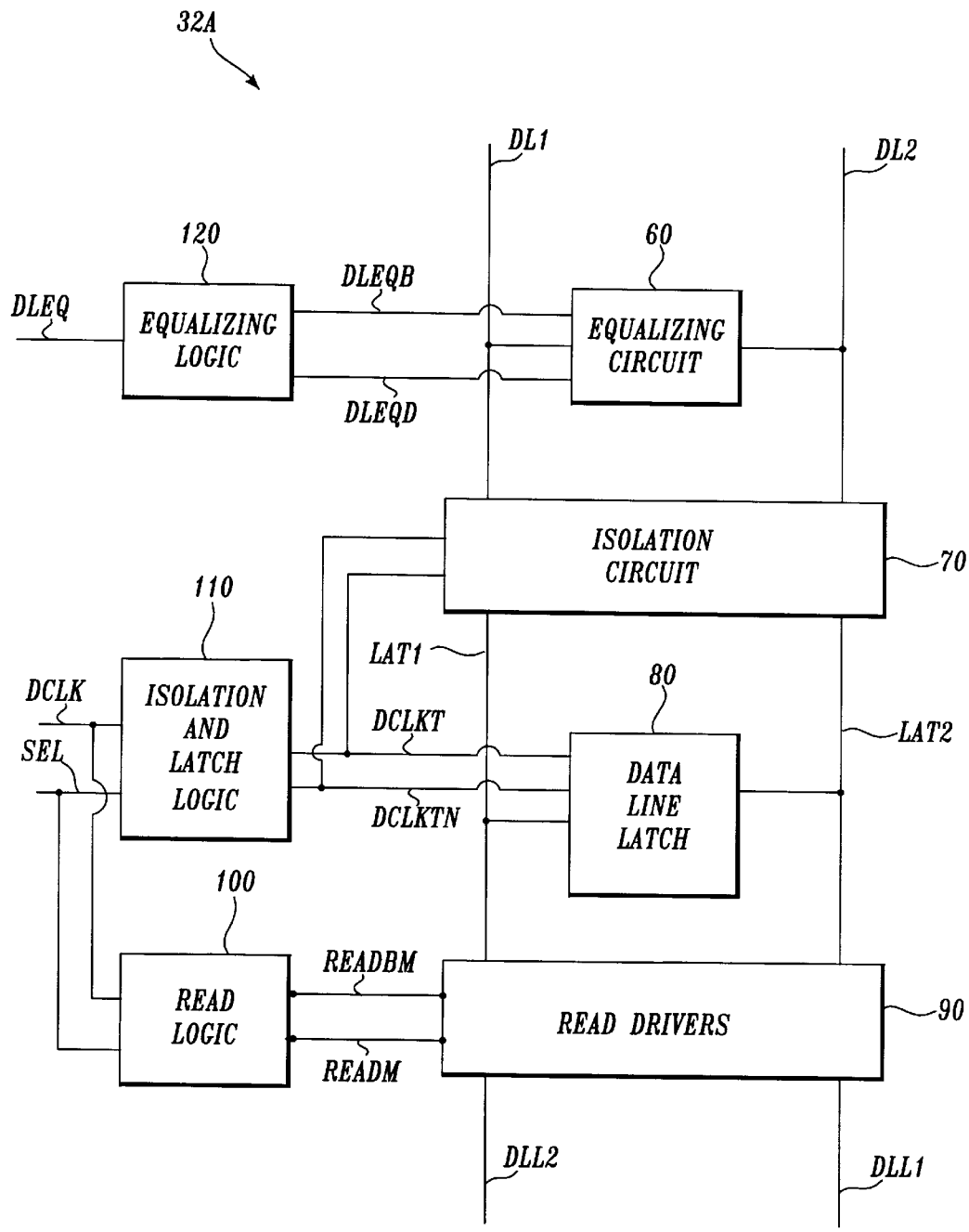
FIG. 2 is a block diagram of a portion of the data line sense amplifier and supporting circuitry of FIG. 1 that is required for a read operation.
Figure 3:
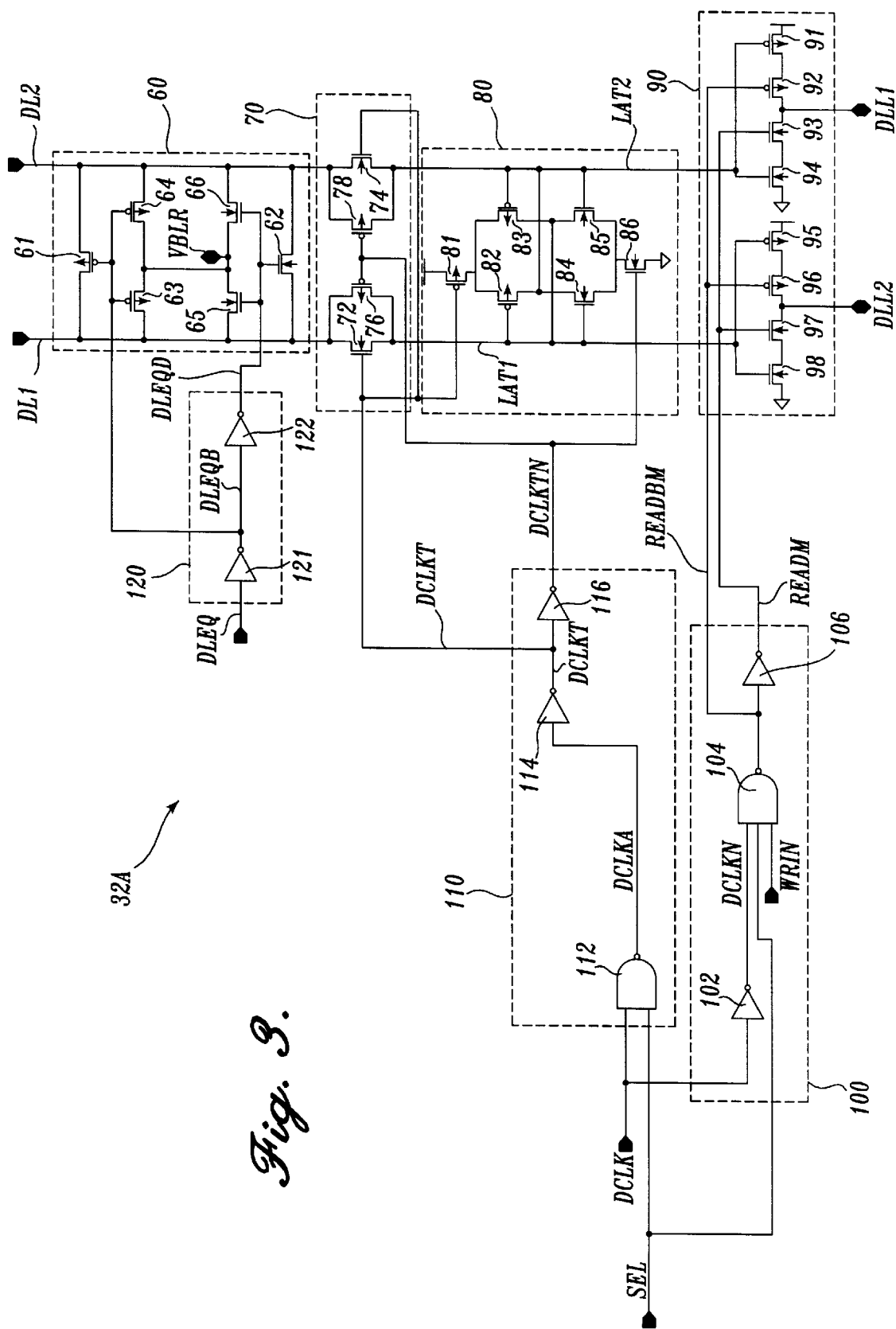
FIG. 3 is a schematic diagram of a practical implementation of the circuit of FIG. 2.
Figure 4:
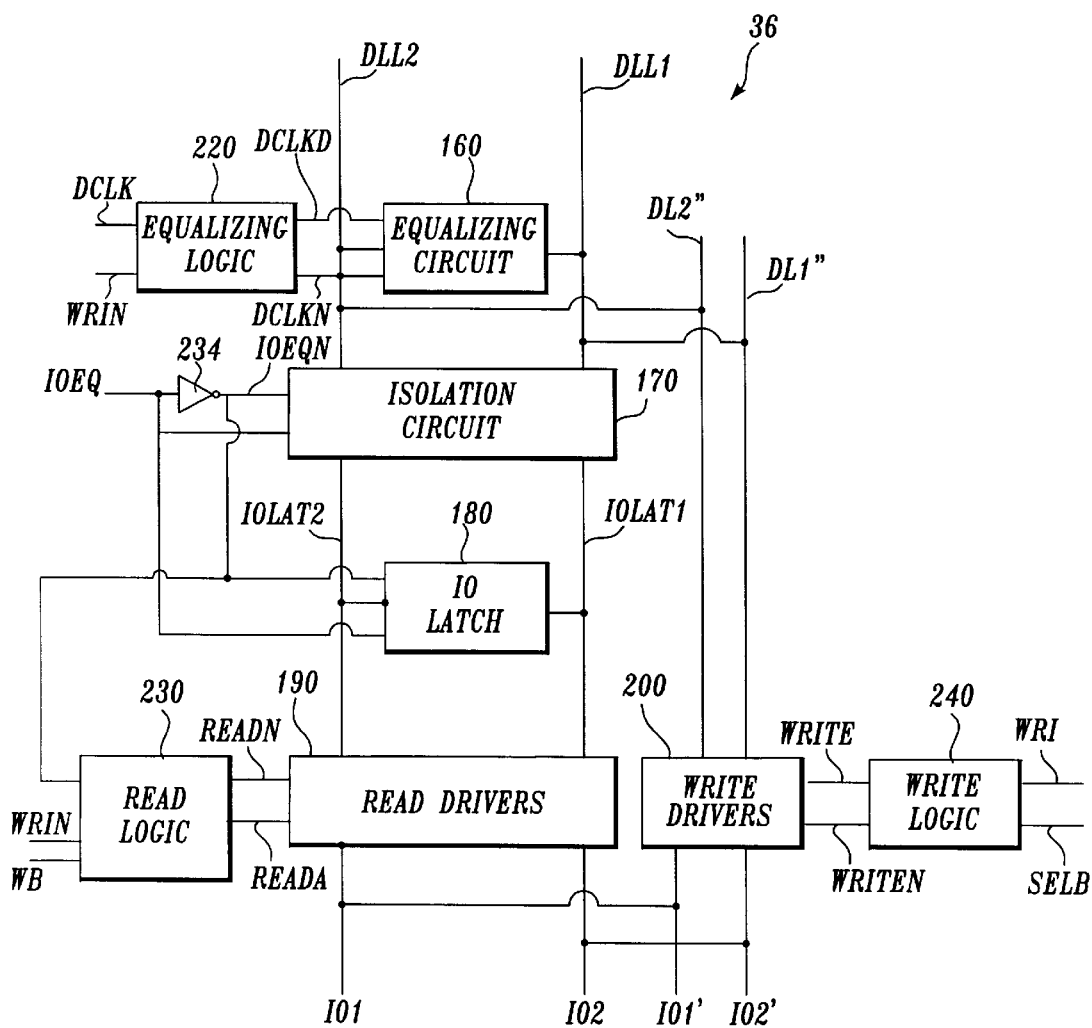
FIG. 4 is a block diagram of a portion of the data line latch sense amplifier and supporting circuitry of FIG. 1.
Figure 5:
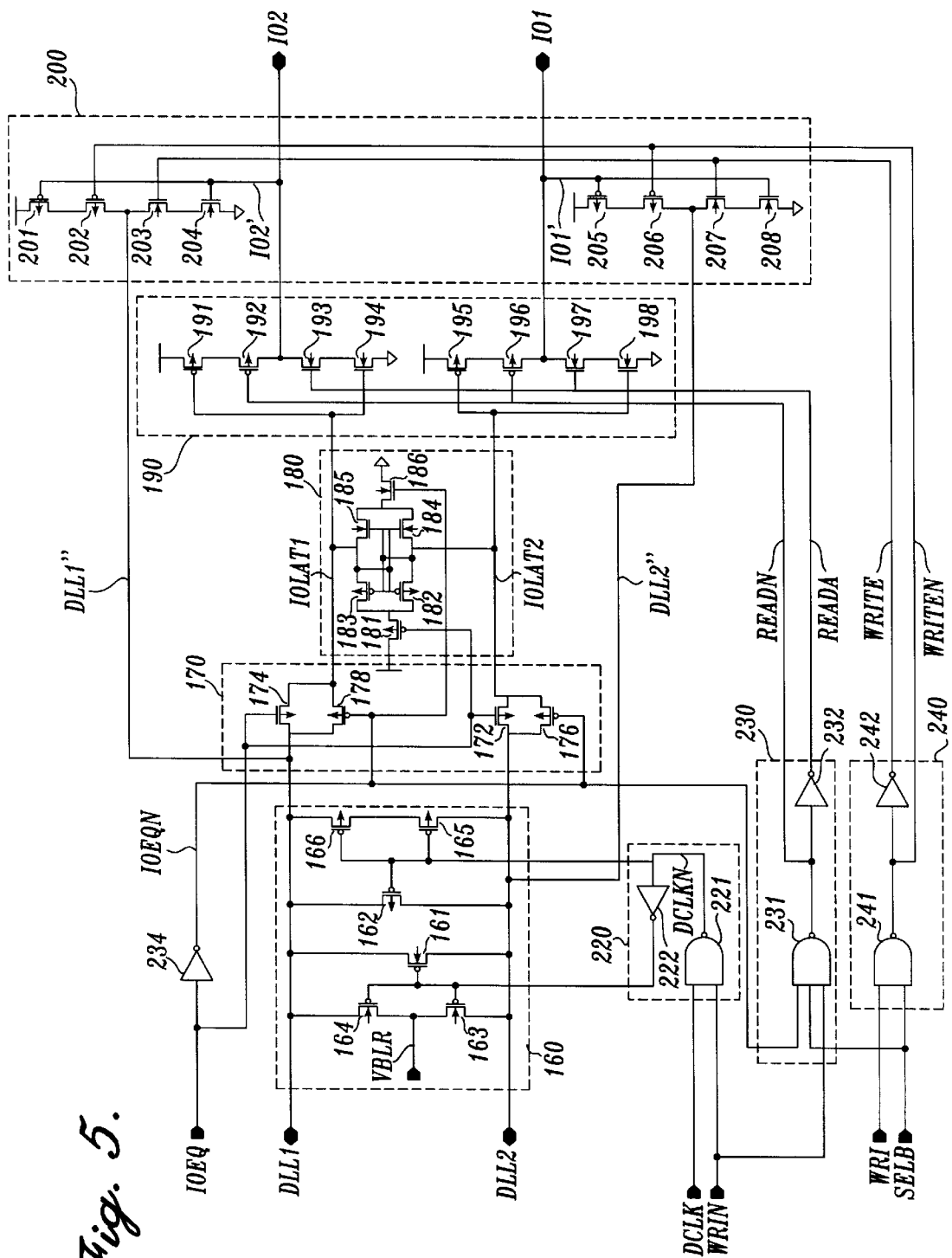
FIG. 5 is a schematic diagram of a practical implementation of the circuit of FIG. 4.
Figure 6:
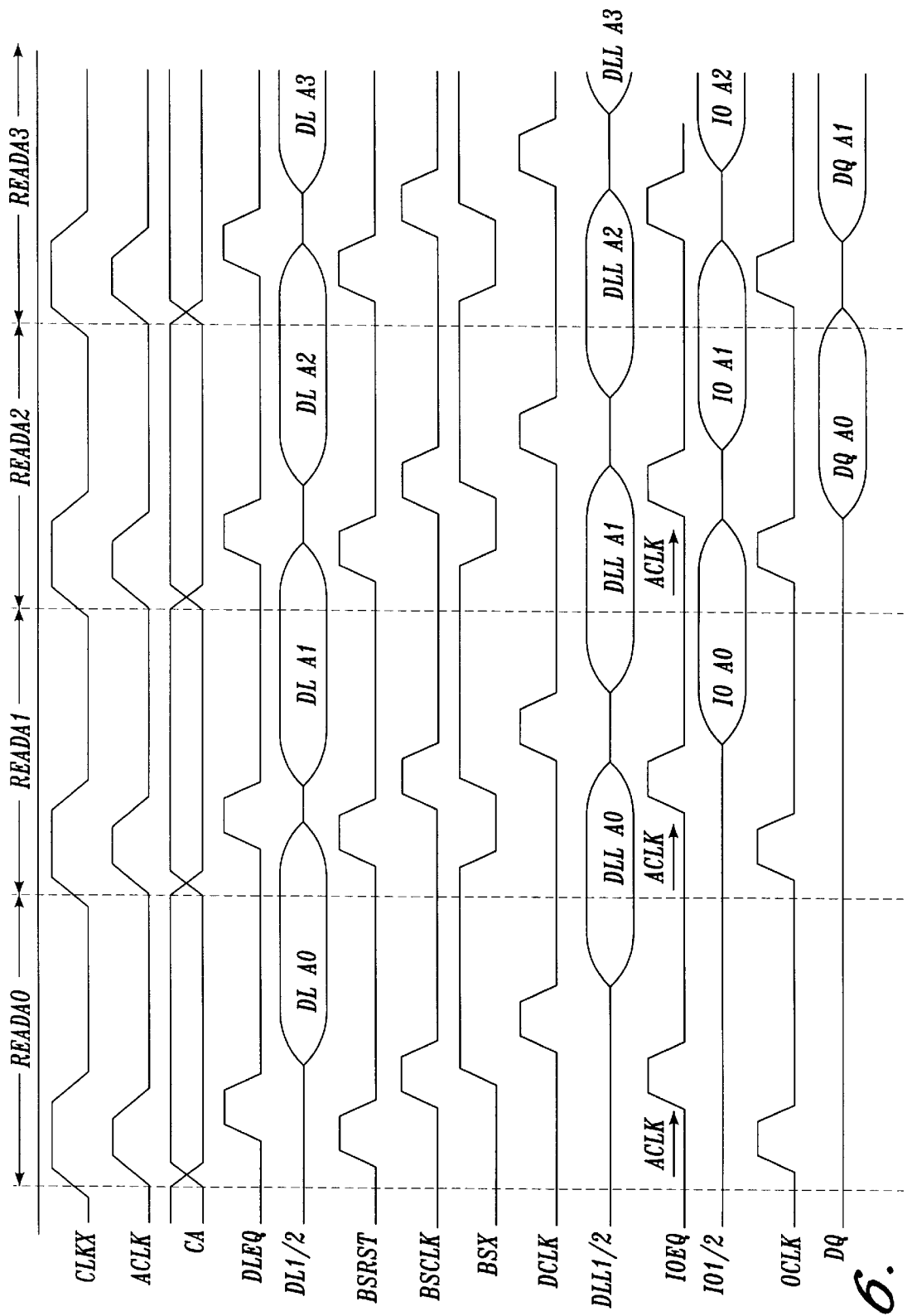
FIG. 6 is a timing diagram showing consecutive read operations for the circuit of FIG. 1.
Figure 7:
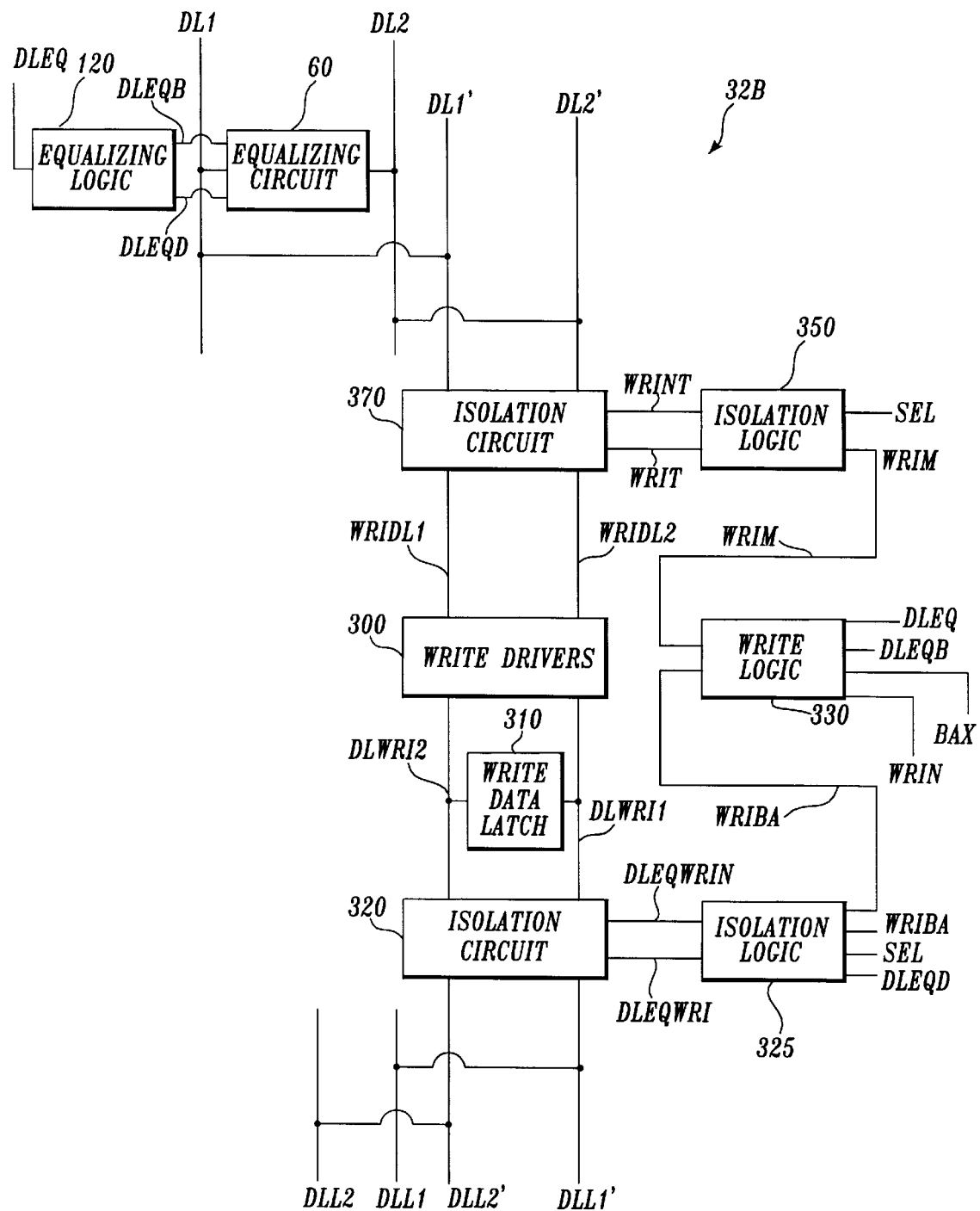
FIG. 7 is a block diagram of a portion of the data line sense amplifier and supporting circuitry of FIG. 1 that is required for a write operation.
Figure 8:
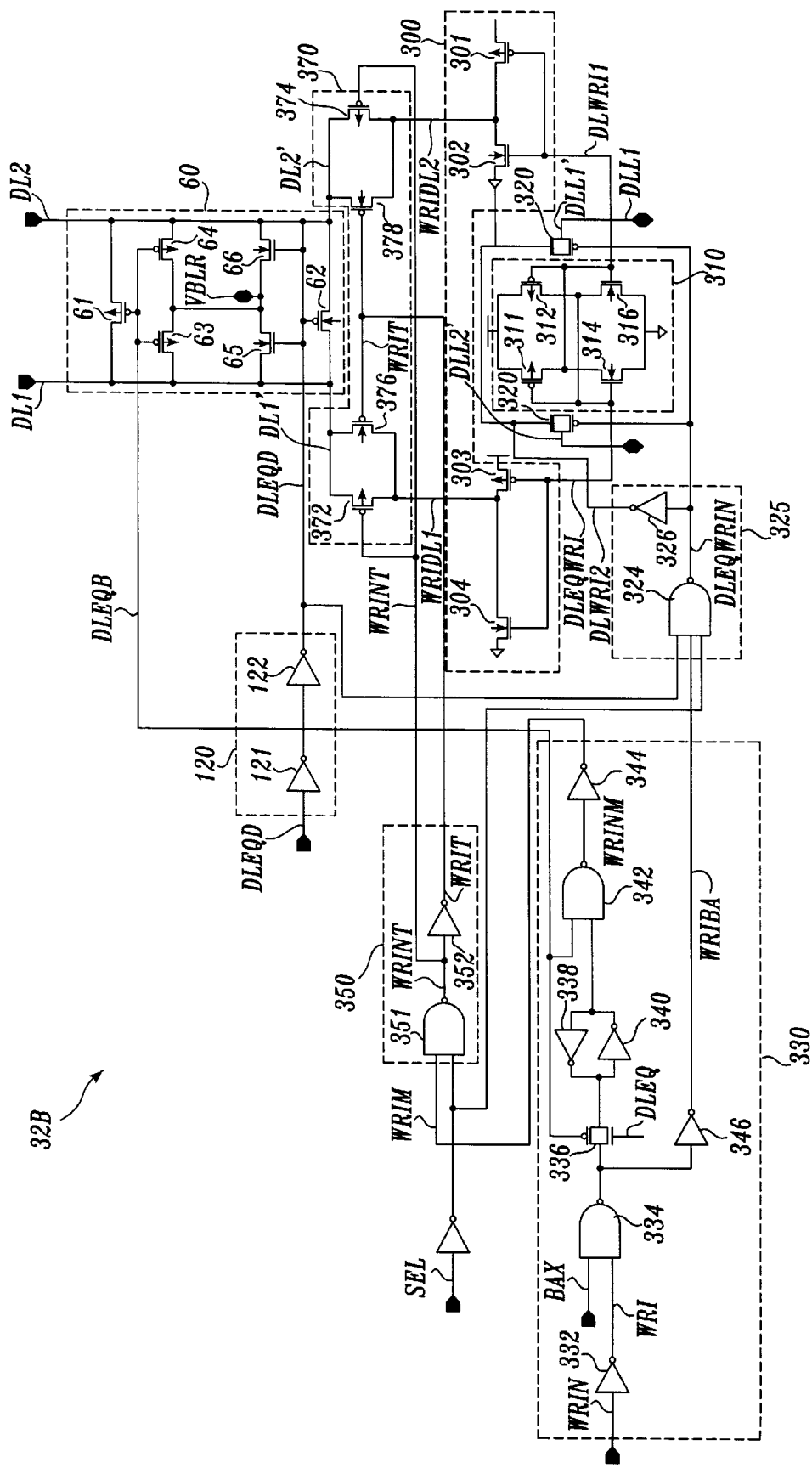
FIG. 8 is a schematic diagram of a practical implementation of the circuit of FIG. 7.
Figure 9:
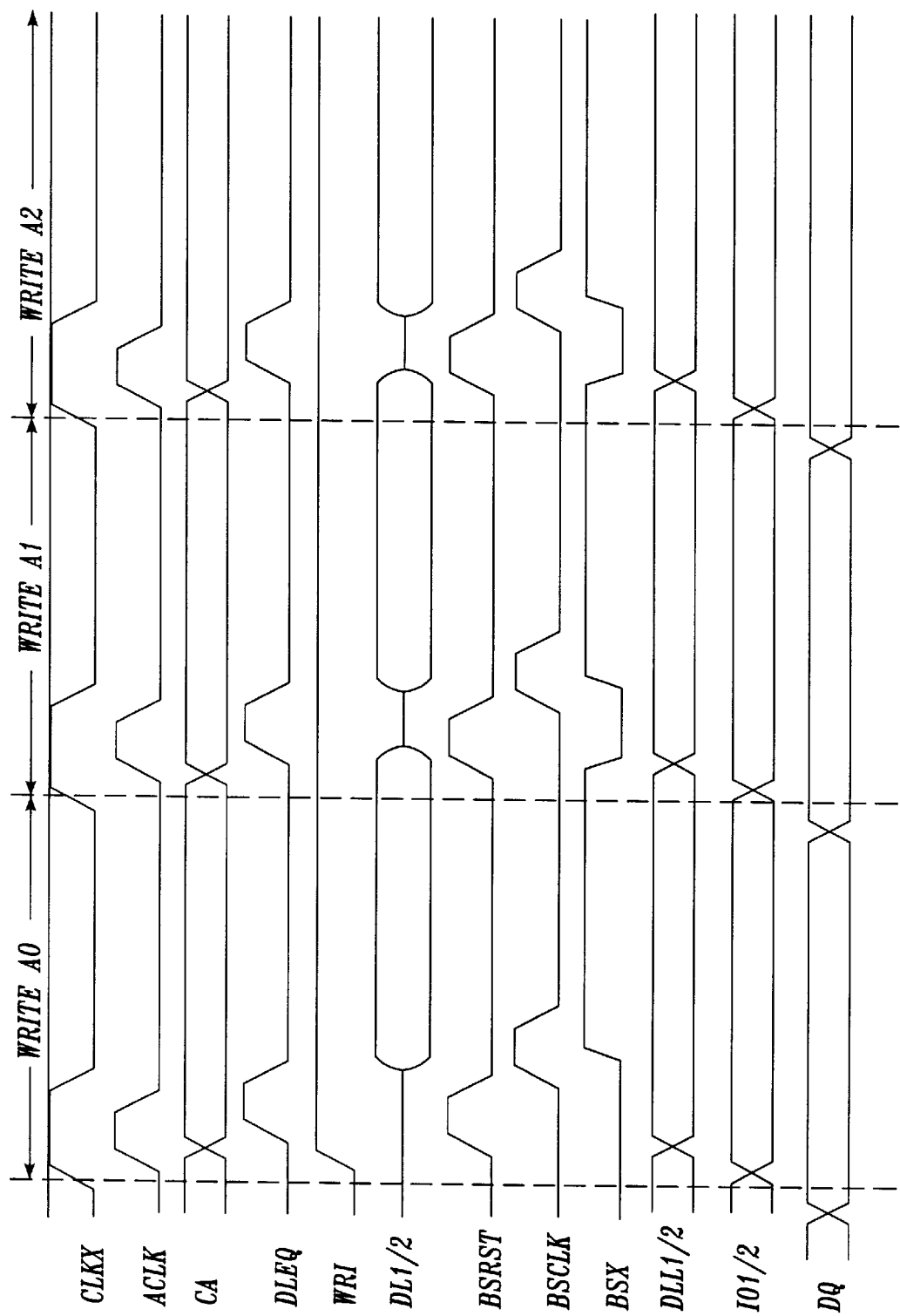
FIG. 9 is a timing diagram showing consecutive write operations for the circuit of FIG. 1.
Figure 10:
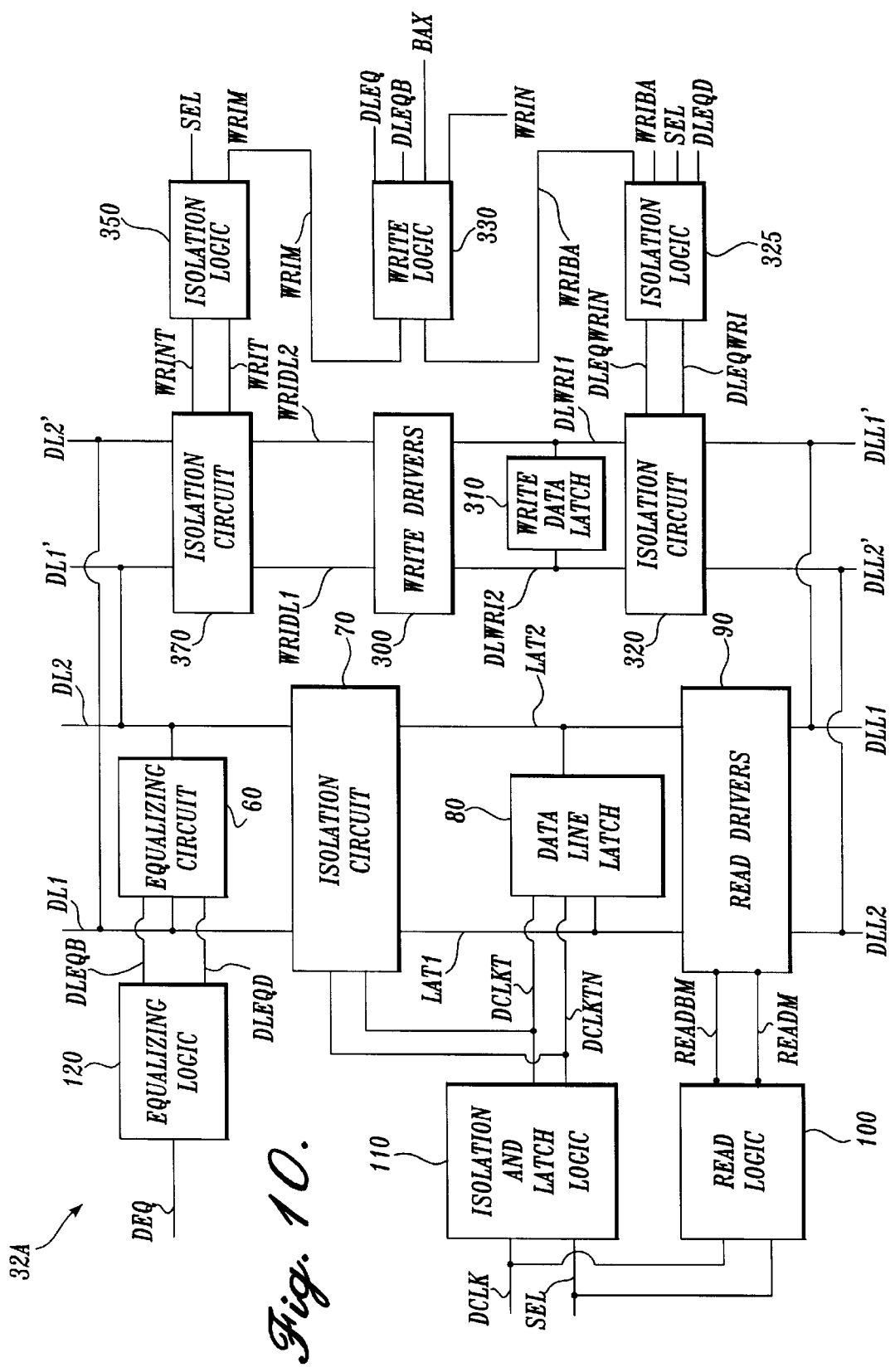
FIG. 10 is a block diagram of the complete data line sense amplifier and supporting circuitry of FIG. 1.
Figure 11:
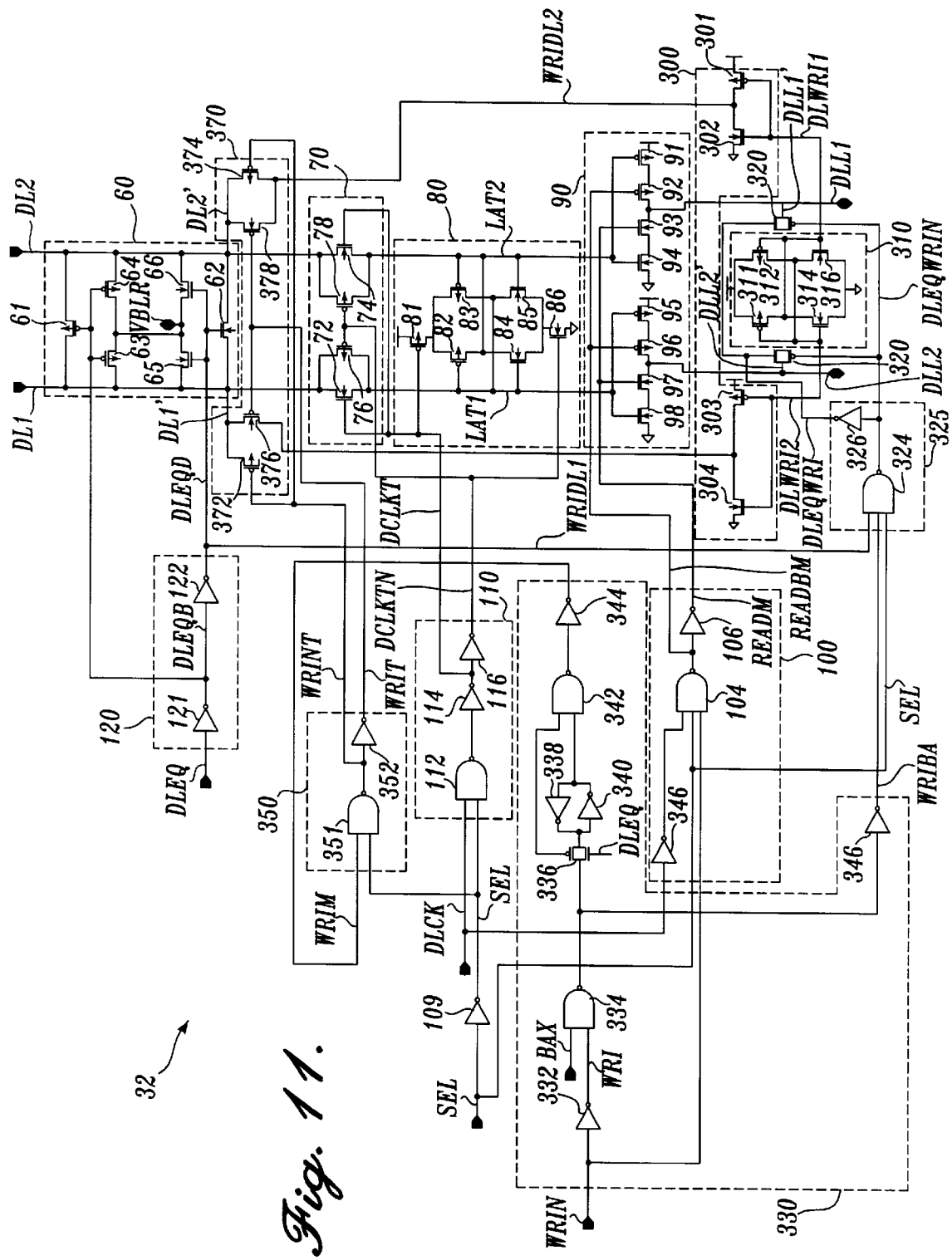
FIG. 11 is a schematic diagram of a practical implementation of the circuit of FIG. 10.
Figure 12:
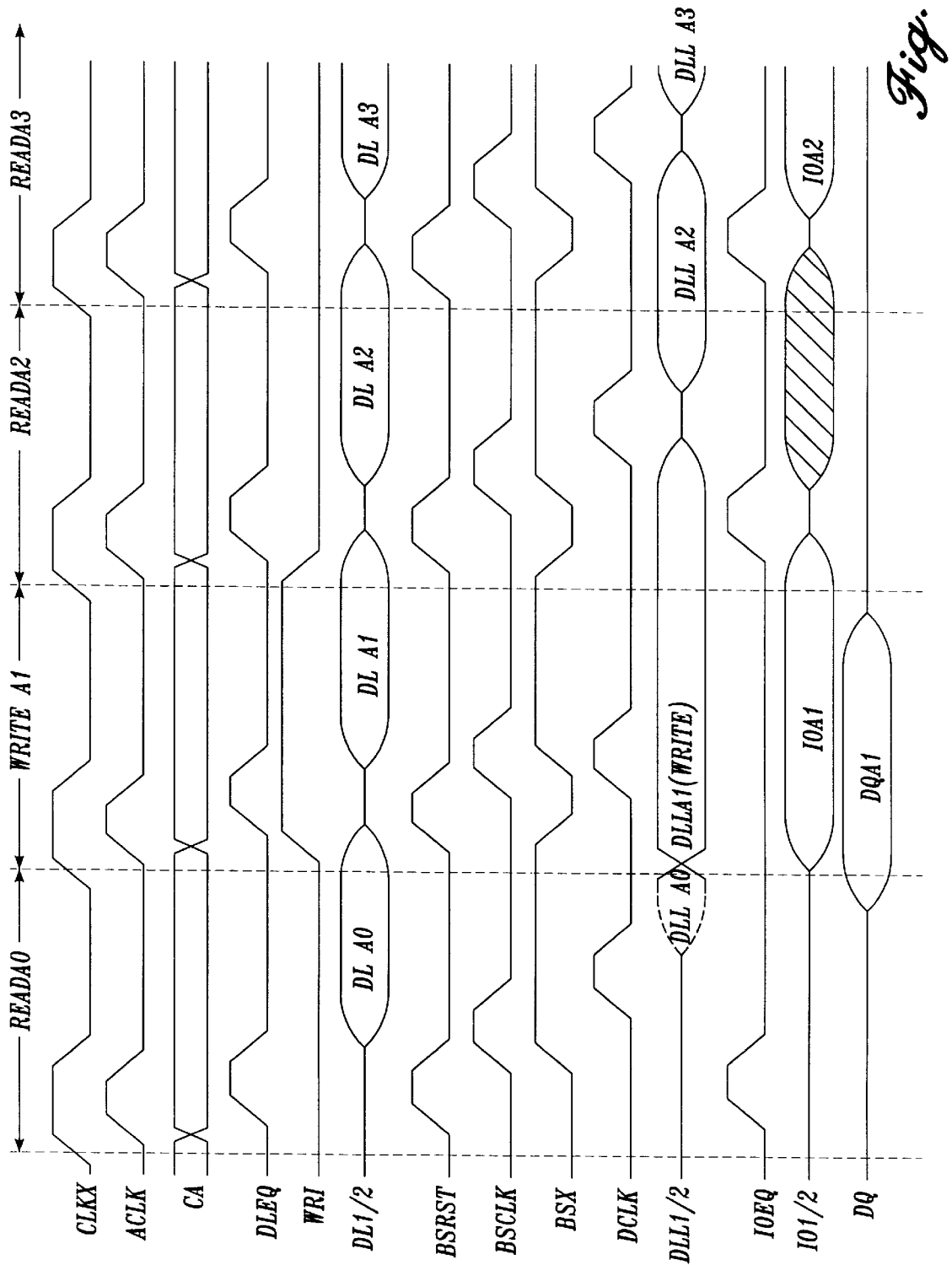
FIG. 12 is a timing diagram showing random read/write operations for the circuit of FIG. 1.

As will be described in more detail below, the above functions are accomplished by including in the data line sense amplifier 32 a set of circuitry that is devoted exclusively to performing read operations and another set of circuitry that is devoted exclusively to performing write operations. The circuitry in the data line sense amplifier 32 that is devoted to the read operations is shown in FIGS. 2 and 3, while the circuitry devoted to the write operations is shown in FIGS. 7 and 8. FIGS. 10 and 11 show both the read and write circuitry of the data line sense amplifier 32 when it is combined together. FIGS. 4 and 5 show the read and write circuitry for the next component, which is the data line latch sense amplifier 36. Various timing diagrams showing the method of operation of the devices are shown in FIGS. 6, 9, and 12. The circuitry will now be described in detail.

Figure 1:
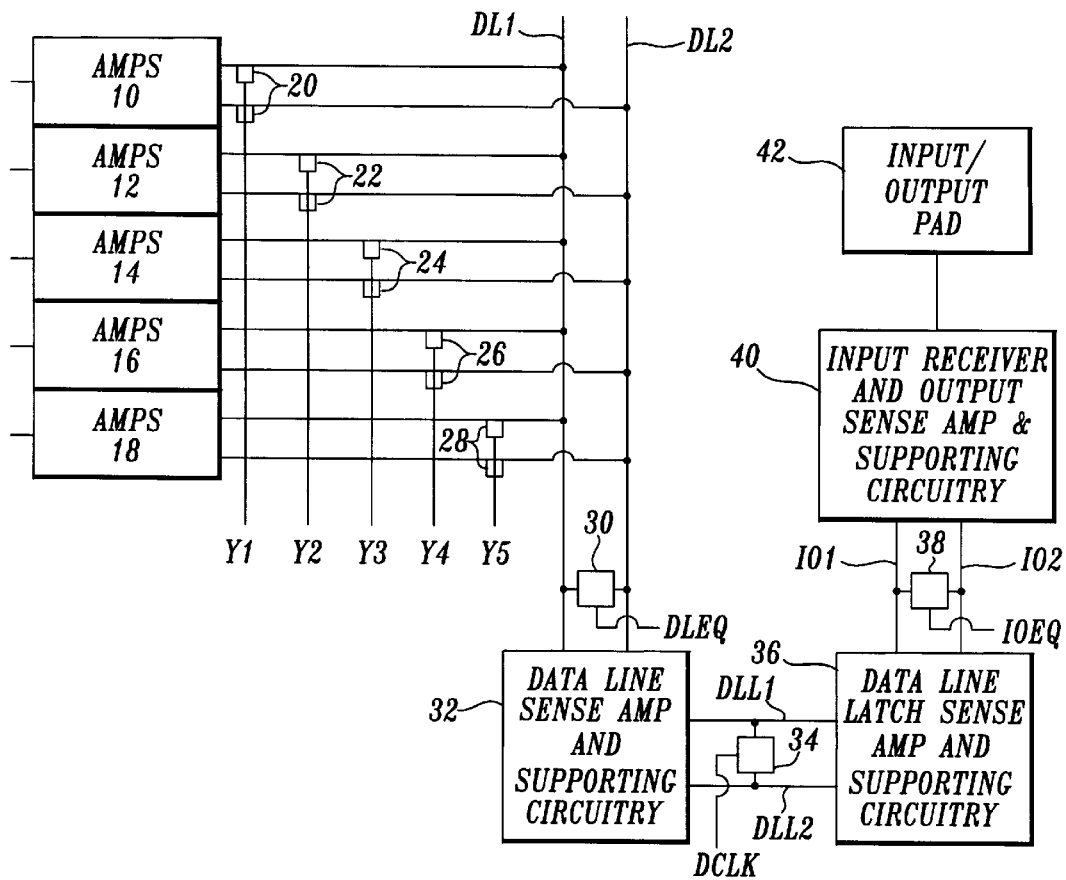
FIG. 1 is a circuit diagram of a semiconductor memory device in which the present invention may be implemented.

FIG. 1 illustrates a memory device in which the high-speed synchronous write control scheme of the present invention may be implemented. As illustrated in FIG. 1, NFET pass gates may be used to implement the Y-decode aspect of the read operation from the memory cells. Specifically, bit line sense amplifiers 10, 12, 14, 16, and 18 are used to amplify signals from a matrix of memory cells (not shown). Pairs of NFET pass gates 20, 22, 24, 26, and 28 are controlled by Y-decode signals Y1, Y2, Y3, Y4, and Y5 to read out signals from the bit sense amplifiers 10, 12, 14, 16, and 18, respectively. Complementary data signals are read out onto data lines DL1 and DL2. A data line sense amplifier and supporting circuitry 32 receives the signals from the data lines DL1 and DL2. On the other side of the circuit, the semiconductor memory device has an input/output pad 42 that is coupled to an input receiver and output sense amplifier and supporting circuitry 40. The input receiver and output sense amplifier and supporting circuitry 40 is coupled to a pair of input/output lines IO1 and IO2. A data line latch sense amplifier and supporting circuitry 36 is also coupled to the input/output lines IO1 and IO2. The data line sense amplifier and supporting circuitry 32 and the data line latch sense amplifier and supporting circuitry 36 are each coupled to data latch lines DLL1 and DLL2. Equalizing circuits 30, 34, and 38 are used to equalize the complementary lines between each of the devices and drive them to a desired mid-level voltage.

FIG. 2 shows a schematic diagram of the read circuitry 32A that is formed in accordance with the present invention as it may be implemented as part of the data line sense amplifier and supporting circuitry 32 (FIG. 1). The read circuitry 32A is required for performing a read operation.

Read circuitry 32A includes an equalizing circuit 60, an isolation circuit 70, a data line latch 80, read drivers 90, read logic circuit 100, isolation and latch logic circuit 110, and equalizing logic circuit 120. Also included in read circuitry 32A are a pair of data lines DL1 and DL2, a pair of latch lines LAT1 and LAT2, and a pair of data latch lines DLL1 and DLL2.

As shown in FIG. 2, equalizing circuit 60 is coupled between the two data lines DL1 and DL2, and is controlled by control signals DLEQB and DLEQD from equalizing logic 120. Equalizing logic 120 receives a control signal DLEQ as its input. Equalizing circuit 60 acts similarly to equalizing circuits 30, 34, and 38 described in FIG. 1, to bring the two data lines DL1 and DL2 to a common mid-level voltage.

The data lines DL1 and DL2 are separated from a data line latch 80 by an isolation circuit 70. Isolation circuit 70 receives control signals DCLKT and DCLKTN from isolation and latch logic circuit 110. Isolation and latch logic circuit 110 receives as inputs control signals DCLK and SEL. Latch lines LAT1 and LAT2 are the outputs of latch 80 and are coupled by isolation circuit 70 to the data lines DL1 and DL2, respectively. The data line latch 80 also receives control signals DCLKT and DCLKTN. As will be described in more detail below, when the isolation circuit 70 is activated, it allows signals to pass from the data lines DL1 and DL2 to the latch lines LAT1 and LAT2, respectively. Once the signals on the latch lines LAT1 and LAT2 reach a certain level, the latch 80 is turned on, which ultimately drives one latch line to $V_{DD}$ and the other to $V_{SS}$, and the isolation circuit 70 is turned off, which isolates the latch lines LAT1 and LAT2 from the data lines DL1 and DL2.

The latch lines LAT1 and LAT2 are separated from the data latch lines DLL2 and DLL1, respectively, by read drivers 90. As will be described in more detail below, read drivers 90 are controlled by control signals READM and READBM so as to drive signals from latch lines LAT1 and LAT2 to data latch lines DLL2 and DLL1, respectively. Control signals READM and READBM are generated by read logic circuit 100, which receives as inputs control signals DCLK and SEL.

A practical implementation of the circuit of FIG. 2 is illustrated in FIG. 3. As shown in FIG. 3, the equalizing logic circuit 120 includes inverters 121 and 122. Equalizing logic circuit 120 generates the signals for controlling the equalizing circuit 60. The input for inverter 121 is signal DLEQ and the output is signal DLEQB. The input for inverter 122 is signal DLEQB and the output is signal DLEQD.

Equalizing circuit 60 includes PFET transistors 61, 63, and 64, and NFET transistors 62, 65, and 66. Although the following source and drain designations for the transistors 61–66 will be made as if the signal on data line DL1 was high and the signal on data line DL2 was low, it will be understood that the source and drain designations may be switched when opposite signals are on the two data lines. According to the present designation, PFET transistor 61 has its source coupled to data line DL1, its drain coupled to data line DL2, and its gate coupled to control signal DLEQB. NFET transistor 62 has its drain coupled to data line DL1, its source coupled to data line DL2, and its gate coupled to control signal DLEQD. As will be described in more detail below, PFET transistor 61 and NFET transistor 62 are used to couple the data lines DL1 and DL2 together following a read cycle when the two data lines are to be brought to a common mid-level voltage. PFET transistor 61 and NFET transistor 62 are intended to facilitate the majority of the voltage equalizing on the data lines DL1 and DL2, as opposed to PFET transistors 63 and 64 and NFET transistors 65 and 66, as described below.

PFET transistor 63 has its source coupled to data line DL1, its drain coupled to mid-level voltage source VBLR, and its gate coupled to control signal DLEQB. PFET transistor 64 has its source coupled to the mid-level voltage source VBLR, its drain coupled to data line DL2, and its gate coupled to control signal DLEQB. NFET transistor 65 has its drain coupled to data line DL1, its source coupled to the mid-level voltage source VBLR, and its gate coupled to control signal DLEQD. NFET transistor 66 has its drain coupled to the mid-level voltage source VBLR, its source coupled to data line DL2, and its gate coupled to the control signal DLEQD. As will be described in more detail below, following a read cycle, the PFET transistors 63 and 64, and the NFET transistors 65 and 66, act to bring the two data lines DL1 and DL2 to the common mid-level voltage dictated by the voltage source VBLR.

The isolation and latch logic circuit 110 includes NAND gate 112, inverter 114, and inverter 116. Isolation and latch logic circuit 110 generates the signals for controlling isolation circuit 70 and the data latch 80. NAND gate 112 receives as its input signals SEL and DCLK, and outputs signal DCLKA. Inverter 114 receives as its input signal DCLKA and outputs signal DCLKT. Inverter 116 receives as its input signal DCLKT and outputs signal DCLKTN.

Isolation circuit 70 includes NFET transistors 72 and 74 and PFET transistors 76 and 78. The source and drain terminals for these transistors will be designated as if higher voltage signals were being passed from the data lines DL1 and DL2 to the latch lines LAT1 and LAT2, but it will be understood that an opposite flow of signals would cause opposite designations for the drains and sources. According to the present designation, NFET transistor 72 has its drain coupled to the data line DL1, its source is coupled to the latch line LAT1, and its gate coupled to the control signal DCLKT. NFET transistor 74 has its drain coupled to the data line DL2, its source coupled to the latch line LAT2, and its gate coupled to the control signal DCLKT. PFET transistor 76 has its source coupled to the data line DL1, its drain coupled to the latch line LAT1, and its gate coupled to the control signal DCLKTN. PFET transistor 78 has its source coupled to the data line DL2, its drain coupled to the latch line LAT2, and its gate coupled to the control signal DCLKTN. As will be discussed in more detail below, when they are biased on, NFET transistors 72 and 74 and PFET transistors 76 and 78 act to pass signals from the data lines DL1 and DL2 to the latch lines LAT1 and LAT2, respectively.

Data line latch 80 includes PFET transistors 81, 82, and 83 and NFET transistors 84, 85, and 86. PFET transistor 81 has its source coupled to the supply rail $V_{DD}$, its drain coupled to the sources of PFET transistors 82 and 83, and its gate coupled to the control signal DCLKT. PFET transistor 82 has its drain coupled to the drain of NFET transistor 84 and also to the latch line LAT2, while its gate is coupled to latch line LAT1. PFET transistor 83 has its drain coupled to the drain of NFET transistor 85 and also to the latch line LAT1, while its gate is coupled to the latch line LAT2. NFET transistor 86 has its source coupled to the lower rail (ground) and its drain coupled to the sources of NFET transistors 84 and 85, while its gate is coupled to the control signal DCLKTN. NFET transistor 84 has its gate coupled to the latch line LAT1, while NFET transistor 85 has its gate coupled to the latch line LAT2. Data line latch 80 is set by the signals on the data lines DL1 and DL2 and its overall function will be described in more detail below with reference to the timing diagrams of FIG. 6.

The read drivers 90 are controlled by the read logic circuit 100. Read logic circuit 100 includes inverters 102 and 106 and a NAND gate 104. NAND gate 104 has three inputs, one of which comes from the output of inverter 102, one of which is the control signal WRIN, and one of which is the control signal SEL. The output of NAND gate 104 is the control signal READBM, which is fed as the input to inverter 106. The output of inverter 106 is the control signal READM.

Latch lines LAT1 and LAT2 are coupled through read drivers 90 to data latch lines DLL2 and DLL1, respectively. The read driver coupled to latch line LAT2 includes PFET transistors 91 and 92 and NFET transistors 93 and 94. The read driver coupled to latch line LAT1 includes PFET transistors 95 and 96 and NFET transistors 97 and 98. While the connections and operation of the read driver connected to latch line LAT2 will be described below, it is understood that the read driver connected to latch line LAT1 is constructed and operates similarly. PFET transistor 91 has its source coupled to $V_{DD}$, its gate coupled to latch line LAT2, and its drain coupled to the source of PFET transistor 92. PFET transistor 92 has its gate coupled to a control signal READBM and its drain coupled to the drain of NFET transistor 93 and also coupled to the line DLL1. NFET transistor 93 has its gate coupled to the signal READM and its source coupled to the drain of NFET transistor 94. NFET transistor 94 has its gate coupled to the latch line LAT2 and its source coupled to ground. The read driver operates such that when the signal on the latch line LAT2 is low, PFET transistor 91 is biased on, and if the signal READBM is also low at that time, a high signal will be passed to the line DLL1. If the latch line LAT2 is high, then the NFET transistor 94 will be biased on, and if the signal READM is high, then a low signal will be passed to the line DLL1.

FIG. 4 shows a schematic diagram of the circuitry of the data line latch sense amplifier and supporting circuitry 36 as it may be implemented according to the present invention. As shown in FIG. 4, this circuitry includes an equalizing circuit 160, an isolation circuit 170, an input/output latch 180, read drivers 190, write drivers 200, an equalizing logic circuit 220, a read logic circuit 230 and a write logic circuit 240. Data line latch sense amplifier and supporting circuitry 36 also includes the pair of data latch lines DLL1 and DLL2, a pair of input/output latch lines IOLAT1 and IOLAT2, and a pair of input/output lines IO1 and IO2.

As illustrated in FIG. 4, equalizing circuit 160 is coupled between the data latch lines DLL1 and DLL2. Equalizing circuit 160 is controlled by control signals DCLKN and DCLKD from equalizing logic circuit 220, which receives as inputs control signals DCLK and WRIN. Equalizing circuit 160 operates similarly to equalizing circuit 60 of FIG. 2, so as to tie the data latch lines DLL1 and DLL2 together and bring them to a common mid-level voltage.

Isolation circuit 170 is coupled between data latch lines DLL1 and DLL2 and input/output latch lines IOLAT1 and IOLAT2, respectively. Input/output latch 180 is coupled between input/output latch lines IOLAT1 and IOLAT2. Isolation circuit 170 and input/output latch 180 are controlled by control signals IOEQ and IOEQN. Isolation circuit 170 and input/output latch 180 operate similarly to isolation circuit 70 and data line latch 80 in FIG. 2. Thus, isolation circuit 170 acts to couple or decouple the data latch lines DLL1 and DLL2 from the input/output latch lines IOLAT1 and IOLAT2, respectively, and input/output latch 180 latches the signals on the input/output latch lines IOLAT1 and IOLAT2.

Read drivers 190 couple input/output latch lines IOLAT1 and IOLAT2 to input/output lines IO2 and IO1, respectively. Read drivers 190 are controlled by control signals READN and READA from read logic circuit 230. Read drivers 190 are similar to read drivers 90 of FIG. 2, and thus act to drive signals from the latch lines IOLAT1 and IOLAT2 to the input/output lines IO2 and IO1, respectively.

Bypass lines 101', 102', DLL1" and DLL2" are included in the circuit for bypassing some of the read circuitry when a write operation is being performed. Bypass lines 101', 102', DLL1" and DLL2" are coupled to lines IO1, IO2, DLL1, and DLL2, respectively. Write drivers 200 couple input/output bypass lines IO1' and IO2' to data latch bypass lines DLL2' and DLL1', respectively. Write drivers 200 are controlled by control signals WRITE and WRITEN from write logic circuit 240, which receives as inputs control signals WRI and SELB. Write drivers 200 act to drive signals from input/output bypass lines IO1' and IO2' to the data latch bypass lines DLL2" and DLL1", respectively.

FIG. 5 illustrates a practical implementation of the circuit of FIG. 4. As shown in FIG. 5, equalizing circuit 160 includes NFET transistors 161, 163, and 164, and PFET transistors 162, 165, and 166. Equalizing circuit 160 is constructed and operates similarly to equalizing circuit 60 of FIG. 2. Thus, when control signal DCLKD is high and signal DCLKN is low, NFET transistor 161 and PFET transistor 162 couple line DLL1 to line DLL2, while NFET transistors 163 and 164 and PFET transistors 165 and 166 couple the lines DLL1 and DLL2 to the midlevel voltage source VBLR.

Isolation circuit 170 includes NFET transistors 172 and 174 and PFET transistors 176 and 178. Isolation circuit 170 is constructed and operates similarly to isolation circuit 70 in FIG. 2. Thus, when NFET transistors 172 and 174 are biased on by a high signal on control signal IOEQ, and PFET transistors 176 and 178 are biased on by a low signal on control signal IOEQN, lines DLL1 and DLL2 are coupled to the input/output latch lines IOLAT1 and IOLAT2, respectively. Control signal IOEQN is generated by inverter 234. Inverter 234 receives as its input signal IOEQ and outputs signal IOEQN.

Input/output latch 180 includes PFET transistors 181, 182 and 183 and NFET transistors 184, 185 and 186. Input/output latch 180 is constructed and operates similarly to the data line latch 80 of FIG. 2. Thus, when NFET transistor 186 is biased on by a high on control signal IOEQN and when PFET transistor 181 is biased on by a low on control signal IOEQ, the input/output latch 180 is turned on. Once the input/output latch 180 is turned on, when a high or low signal appears on either of the lines IOLAT1 or IOLAT2, the other line IOLAT1 or IOLAT2 is correspondingly driven to the opposite state by the function of the latch.

Tristate read drivers 190 include two read drivers coupled to input/output latch lines IOLAT1 and IOLAT2. The tristate read driver coupled to input/output latch line IOLAT1 includes PFET transistors 191 and 192 and NFET transistors 193 and 194, while the tristate read driver coupled to input/output latch line IOLAT2 includes PFET transistors 195 and 196 and NFET transistors 197 and 198. Tristate read drivers 190 are constructed and operate similarly to tristate read drivers 90 of FIG. 2. Thus, when control signal READN is low and control signal READA is high, signals on the input/output latch lines IOLAT1 and IOLAT2 are inverted and driven to input/output lines 102 and 101, respectively.

Control signals READN and READA are generated by read logic circuit 230. Read logic circuit 230 includes NAND gate 231 and inverter 232. NAND gate 231 receives as its inputs signals IOEQN, WRIN and SELB, and outputs signal READN. Inverter 232 receives as its input signal READN and outputs signal READA. Thus, when signal READA is high and signal READN is low, NFET transistors 197 and 193 and PFET transistors 196 and 192 of the read drivers 190 are biased on, thus allowing signals on the input/output latch lines IOLAT1 and IOLAT2 to be inverted and driven to the input/output lines IO2 and IO1, respectively.

Tristateable write drivers 200 include two write drivers coupled to input/output bypass lines IO1' and IO2'. The tristate write driver coupled to input/output bypass line IO2' includes PFET transistors 201 and 202, and NFET transistors 203 and 204, while the write driver coupled to input/output bypass line IO1' includes PFET transistors 205 and 206, and NFET transistors 207 and 208. Write drivers 200 are constructed and operate similarly to read drivers 190. Thus, when control signal WRITE is high and control signal WRITEN is low, signals on input/output lines IO2 and IO1 are inverted and driven to the data latch lines DLL1" and DLL2", respectively.

Control signals WRITE and WRITEN are generated by write logic circuit 240. Write logic circuit 240 includes NAND gate 241 and inverter 242. NAND gate 241 receives as its input signals WRI and SELB, and outputs signal WRITEN. Inverter 242 receives as its input signal WRITEN and outputs signal WRITE. When signal WRITE is high and signal WRITEN is low, NFET transistors 203 and 207 and PFET transistors 202 and 206 of write drivers 200 are biased on, thus allowing signals from input/output lines IO2 and IO1 to be inverted and driven to lines DLL1" and DLL2", respectively.

FIG. 6 illustrates timing diagrams for the circuitry of FIGS. 1, 2 and 4 when consecutive READ operations are being performed with a CAS latency of 3 (CL3) mode of operation. As illustrated in FIG. 6, during a first timing cycle designated READA0, the external clock signal CLKX goes high. The CLKX signal going high causes the signal ACLK to go high a short time later. At the same time, the column address signal CA also transitions. The signal ACLK going high causes the signal DLEQ to first transition high and then automatically transition low a short time later. As shown in FIGS. 2 and 7, the signal DLEQ is an input to the equalizing logic circuit 120. As described earlier, while the signal DLEQ is high, equalizing logic circuit 120 causes the signal DLEQD to be high and signal DLEQB to be low, such that equalizing circuit 60 is turned on and the data lines DL1 and DL2 are tied together and brought to a mid-level voltage as dictated by the voltage source VBLR. At this point during timing cycle READA0, the data lines DL1 and DL2 are already at the mid-level voltage, and therefore no change appears in the timing diagrams.

The signal ACLK going high also causes the bit switch reset signal BSRST to transition high and then automatically transition low a short time later. The signal BSRST going high causes the bit switch clock signal BSCLK to transition high, and then automatically transition low a short time later. The signal BSRST going high also causes the signal BSX to restore low. The signal BSCLK going high causes a single decoded signal BSX to transition high a short time later. The bit switch signal BSX going high would correspond to one of the signals Y1 to Y5 in FIG. 1, thus allowing one of the sense amplifiers 10–18 to pass data signals to the data lines DL1 and DL2. This is illustrated by the signal DL1/2 in FIG. 6, which can be seen to generate a differential voltage across the two data lines DL1 and DL2.

The signal BSCLK going high also causes the signal DCLK to go high and then automatically transition low a short time later. As shown in FIG. 2, the signal DCLK is an input to the read logic 100 and the isolation and latch logic 110. Thus, during a read cycle, the signal DCLK going high causes the isolation circuit 70 to isolate the data lines DL1 and DL2 from the latch lines LAT1 and LAT2, and to cause the data line latch 80 to be set. Also, as illustrated in FIG. 4, the signal DCLK is an input to the equalizing logic 220. Thus, during the read cycle when the signal WRIN is high, the signal DCLK going high causes the equalizing circuit 160 to couple the data latch lines DLL1 and DLL2 together and drive them to a common mid-level voltage as dictated by the voltage VBLR. During the timing period READA0 in FIG. 6, the data latch lines DLL1 and DLL2 are already at the mid-level voltage, and thus show no change. Also occurring during the time READA0, the signal OCLK automatically transitions high and then low near the beginning of the cycle, and the signal IOEQ automatically transitions high and then low a short time later.

During the timing cycle READA1, the signals CLKX, ACLK, CA, DLEQ, BSRST, BSCLK, BSX, DCLK, IOEQ, and OCLK all transition exactly as they did during the timing cycle READA0. However, during the timing cycle READA1 at the time that the signal DLEQ transitions high, a voltage differential exists on the data lines DL1 and DL2. Thus, the signal DLEQ activates the equalizing circuit 60, as described previously, so as to cause the data lines DL1 and DL2 to be coupled together and driven to a mid-level voltage. Once the signal DLEQ goes low, and the signal BSX goes high, the data lines DL1 and DL2 are again able to maintain differential voltage as data is passed from the selected sense amplifier. Also, as a voltage differential exists on the data latch lines DLL1 and DLL2 when the signal DCLK transitions high, as described previously, the data latch lines DLL1 and DLL2 are coupled together by equalizing circuit 160 (FIG. 4) and driven to a common mid-level voltage. Once the signal DCLK transitions low, the data latch lines DLL1 and DLL2 are again allowed to develop a differential voltage as a signal is passed from the read drivers 90 of FIG. 2. Also, as the signal IOEQ goes low, the input/output lines IO1 and IO2 are able to develop a differential voltage as data from the input/output latch 180 (FIG. 4) is passed through read drivers 190 (FIG. 4). Although not shown, the input/output latch 180 and input/output latch lines IOLAT1 and IOLAT2 were previously set by signals from the data latch lines DLL1 and DLL2. It should be noted that the data driven on the input/output lines IO1 and IO2 corresponds to the data that was originally read out from the memory cells on the data lines DL1 and DL2 during the timing cycle READA0.

Timing cycle READA2 repeats most of the signal transitions shown in the timing cycle READA1. The primary difference is that this time, when the signal OCLK goes high, data is driven on the line DQ. It should be noted that the data driven on the line DQ corresponds to data that was originally read out from the memory cells during the timing cycle READA0. Thus, the overall memory device has a read-out latency of three timing cycles. Timing cycle READA3 continues the process with the data from the timing cycle READA1 now appearing on the line DQ.

FIG. 7 shows the write circuitry 32b that is formed according to the present invention as it may be implemented as the part of the data line sense amplifier and supporting circuitry 32, FIG. 1 which is required for performing the write operations. As illustrated in FIG. 7, write circuitry 32b includes equalizing circuit 60, isolation circuit 370, write drivers 300, write data latch 310, isolation circuit 320, equalizing logic 120, isolation logic circuit 350, write logic circuit 330, and isolation logic circuit 325. Also included in write circuitry 32b are the pair of data lines DL1 and DL2, a pair of lines WRIDL1 and WRIDL2, a pair of lines DLWRI2 and DLWRI1, and the pair of data latch lines DLL1 and DLL2, and a pair of data latch bypass lines DLL1' and DLL2' and DL1 ' and DL2'.

Bypass lines DL1', DL2', DLL1' and DLL2' are included to bypass some of the read circuitry during a write operation. Bypass lines DL1', DL2', DLL1' and DLL2' are coupled to lines DL1, DL2, DLL1 and DLL2, respectively.

Isolation circuit 370 isolates data bypass lines DL1' and DL2' from the lines WRIDL1 and WRIDL2, respectively. Isolation circuit 370 is controlled by control signals WRINT and WRIT, which are generated by isolation logic circuit 350, which receives as inputs control signals SEL and WRIM. Write drivers 300 are coupled between lines DLWRI1 and DLWRI2 and lines WRIDL2 and WRIDL1, respectively. Write drivers 300 drive signals from the lines DLWRI2 and DLWRI1 to the lines WRIDL1 and WRIDL2, respectively.

Write data latch 310 is coupled between lines DLWRI2 and DLWRI1. Write data latch 310 does not receive any control signals and simply acts to latch signals as they appear on the linesDLWRI2 and DLWRI1. Isolation circuit 320 couples lines DLWRI2 and DLWRI1 to the data latch bypass lines DLL2' and DLL1', respectively. Isolation circuit 320 is controlled by control signals DLEQWRI and DLEQWRIN, which are generated by isolation logic circuit 325, which receives as inputs control signals WRIBA, SEL and DLEQD. Write logic 330 generates control signals WRIBA and WRIM, which are used as inputs for isolation logic circuit 325 and isolation logic circuit 350, respectively. Write logic 330 receives as inputs control signals DLEQ, DLEQB, BAX and WRIN.

FIG. 8 illustrates a practical embodiment of the circuitry of FIG. 7. As shown in FIG. 8, write drivers 300 include two write drivers coupled to lines DLWRI2 and DLWRI1. The write driver coupled to line DLWRI1 consists of PFET transistor 301 and NFET transistor 302, and the write driver coupled to line DLWRI2 consists of PFET transistor 303 and NFET transistor 304.

Write data latch 310 consists of PFET transistors 311 and 312 and NFET transistors 314 and 316. The sources of PFET transistors 311 and 312 are coupled to the voltage source VDD. The drain of PFET 311 is coupled to the drain of NFET 314 and is also coupled to line DLWRI1. The drain of PFET 312 is coupled to the drain of NFET 316 and is also coupled to the line DLWRI2. The sources of NFETs 314 and 316 are coupled to ground. Thus, the latch 310 is formed in typical crosscoupled formation, so that the lines DLWRI2 and DLWRI1 are latched at opposite states. Pass gates 320 are coupled to the bypass lines DLL1' and DLL2' from the lines DLWRI1 and DLWRI2, respectively. Signals from bypass lines DLL2' and DLL1' are passed to the write latch 310 through the pass gates 320 so as to set the latch. When control signal DLEQWRI is high and control signal DLEQWRIN is low, the pass gates 320 are opened such that signals from bypass lines DLL1' and DLL2' are transferred to the lines DLWRI1 and DLWRI2, respectively.

Control signals DLEQWRI and DLEQWRIN are generated by isolation logic circuit 325. Isolation logic circuit 325 includes NAND gate 324 and inverter 326. NAND gate 324 receives as its inputs signals DLEQD, WRIBA, and SEL, and outputs signal DLEQWRIN. Inverter 326 receives as its input signal DLEQWRIN and outputs signal DLEQWRI.

Isolation circuit 370 includes PFET transistors 372 and 374 and NFET transistors 376 and 378. Isolation circuit 370 operates similarly to isolation circuit 70 of FIG. 2. Thus, when signal WRIT is high and signal WRINT is low, the transistors of isolation circuit 370 are biased on such that signals from the write latch that are driven through the write drivers are allowed to pass to the data lines DL1 and DL2.

Control signals WRINT and WRIT are generated by isolation logic circuit 350. Isolation logic circuit 350 includes NAND gate 351, and inverter 352. NAND gate 351 receives as its inputs signal SEL and signal WRIM, and outputs signal WRINT. Inverter 352 receives as its input signal WRINT and outputs signal WRIT.

The signal WRIM that is an input to the NAND gate 351 and the signal WRIBA that is an input to the NAND gate 324 come from the write logic circuit 330. Write logic circuit 330 includes inverter 332, NAND gate 334, pass gate 336, inverters 338 and 340, NAND gate 342, and inverters 344 and 346. The output of inverter 332 is connected as an input to NAND gate 334. The output of NAND gate 334 is an input to pass gate 336 and inverter 346. The output of inverter 346 is signal WRIBA. Pass gate 336 is controlled by signals DLEQ and DLEQB from the input and output to inverter 121, respectively. The output of pass gate 336 is coupled to the input of inverter 340 and the output of inverter 338, while the output of inverter 340 is coupled to the input of inverter 338 and also coupled as an input to NAND gate 342. NAND gate 342 also receives an input from signal DLEQB. The output of NAND gate 342 is coupled to the input of inverter 344 and the output of inverter 344 is the signal WRIM.

FIG. 9 illustrates timing diagrams for consecutive write operations. As shown in FIG. 9, many of the signals are identical to the signals shown in FIG. 6 for consecutive read operations. Specifically, signals CLX, ACLK, CA, DLEQ, DL1/2, BSRST, BSCLK and BSX are identical to their appearance during the read cycles of FIG. 6. During a write operation, certain clocks are disabled in the circuit, as shown during timing cycle WRITEA0 where clock signals DCLK and IOEQ do not appear because they are disabled (low). Disabling these clocks allows data on the line DQ to be quickly transitioned to the input/output lines IO1 and IO2 through the input receiver, and then quickly transitioned to the data latch lines DLL1 and DLL2. This data is then transitioned to the data lines DL1 and DL2.

Because of the rapid nature with which the data is passed to and from the various lines once the clocks are disabled, it should be noted that the data from the line DQ has arrived on the data lines DL1 and DL2 at the same time the data would have been read out from a memory cell on to the data lines DL1 and DL2 during the first cycle period, which in this case is during timing cycle WRITEA0. The arrival of the data on the lines DL1 and DL2 at the same time for a write or read operation is a key aspect of the invention that will be described in more detail below. It can be seen that this process repeats for timing cycles WRITEA1 and WRITEA2.

FIG. 10 shows the complete data line sense amplifier and supporting circuitry 32 of FIG. 1 as it may be implemented according to the present invention. FIG. 10 thus combines the read circuitry 32A of FIG. 2 and the write circuitry 32B of FIG. 7 by coupling the respective lines DL1, DL2, DLL1 and DLL2 to their identically named counterparts. FIG. 11 shows the practical implementation circuitry for the circuit of FIG. 10, and thus combines the practical implementations shown in FIGS. 3 and 8.

FIG. 12 illustrates a timing diagram for random read and write operations. Timing cycles READA0, READA2 and READA3 are similar to the corresponding named read timing cycles of FIG. 6. The timing cycle WRITEA1 is similar to the correspondingly named timing cycle WRITEA1 in FIG. 9.

As shown in the timing cycle READA0 in FIG. 12, the timing signals are similar to those in the timing cycle READA0 in FIG. 6, except that near the end of the timing cycle, the signal on the line DQ begins to change as write data begins to appear. During the timing cycle WRITEA1 of FIG. 12, the timing signals are similar to those in the timing cycle WRITEA1 of FIG. 9. Thus, the read data on the data latch lines DLL1 and DLL2 is shown to be overwritten by the write data that is transitioning from the input/output lines IO1 and IO2. This write data is then transitioned to the data lines DL1 and DL2 after DL1 and DL2 are precharged to VBLR with DLEQ and then is written into the selected sense amplifier.

During the timing cycle READA2, the input/output lines IO1 and IO2 do not receive any data, because the data that was read during the timing cycle READA0 that would have otherwise been transitioning to the input/output lines IO1 and IO2 from the data latch lines DLL1 and DLL2 was overwritten by the write data, as described previously during the timing cycle WRITEA1.

During the timing cycle READA3, the input/output lines IO1 and IO2 receive the data that was read on to the data lines DL1 and DL2 during the timing cycle READA2. However, line DQ still does not have any read data, since the transitioning of the write data across the paired lines during timing cycle WRITEA1 and the read cycle latency of three timing cycles causes no read data to appear on the line DQ until a third timing cycle following the write timing cycle.

Thus, as illustrated in FIG. 12, during the timing cycles READA0, READA2, and READA3, read operations are performed, while during timing cycle WRITEA1, a write operation is performed. Whether the next operation is a read or write is not known at the data line sense amp 32 (FIG. 1) until the data lines DL1 and DL2 enter their precharge state when the signal DLEQ goes high. At that time, the signal WRIN and the inverted signal WRI essentially control whether a read or write operation is performed. The operation is determined when the signal DLEQ is high and the signal WRIN remains high or low, as described below.

If the signal WRIN is low when the signal DLEQ is high, a write operation Will be performed in the following manner. As described previously with reference to FIG. 8, a low signal WRNcauses inverter 332 to output a high signal WRI. A high signal WRI, coupled with a high signal BAX, causes NAND gate 334 to output a low signal. Then, when the DLEQ signal goes high and inverted signal DLEQB goes low (FIG. 8), pass gate 336 is opened to allow the low signal to pass from the output of NAND gate 334. The low signal outputted from NAND gate 354 causes signal WRIBA from inverter 346 to transition high. When signal WRIBA transitions high, it is coupled with signals SEL and DLEQD transitioning high, which causes signal DLEQWRIN from NAND gate 324 to transition low; which causes DLBQWRI from inverter 326 to transition high. Signal DLEQWRI transitioning high and signal DLEQWRIN transitioning low causes pass gates 320 to open and thus allows the signals on lines DLL1 and DLL2 to set the latch 301.

Then, once the DLEQ signal goes low and inverted signal DLEQB goes high, NAND gate 342 in the write logic 330 combines the high output from inverter 340 and the high output from signal DLEQB, and correspondingly outputs a low signal as signal WRINM. Low signal WRINM is inverted by inverter 344 to become a high signal WRIM. High signal WRIM is then combined with a high signal SEL by NAND gate 351 in isolation logic circuit 350. NAND gate 351 then outputs a low signal WRINT, which along with inverted high signal WRIT, controls isolation circuit 370. When signal WRINT is low and signal WRIT is high, isolation circuit 370 allows data that is stored on the write data latch 310 to be driven onto data lines DL1 and DL2, thus performing a write operation. Thus, in this manner the signal WRIN being low when the signal DLEQ is high causes a write operation to be performed.

Conversely, if the WRIN signal is high when the signal DLEQ goes high, a read operation will be performed in the following manner. As described above with reference to FIG. 3, when signals WI, SEL and DCLKN are high, then data latch 80 latches data from data lines DL1 and DL2 and NAND gate 104 correspondingly outputs a low signal as signal READBM. Low signal READBM and inverted high signal READM turn on read drivers 90. Read drivers 90 drive the data signals held on latch lines LAT1 and LAT2 to the data latch lines DLL2 and DLL1, respectively, thus performing a read operation. Thus, in this manner, the signal WRIN being high while DLEQ is high causes a read operation to be performed.

As described above, one of the key advantages of the invention is that the read and write operations are synchronized with the data line equalization clock signal DLEQ. This allows the circuit to perform a write operation within the same clock timing as the read. This technique allows for the operation in the previous cycle to complete before the next operation is to occur regardless if the previous or next operation is a read or a write. More specifically, for timing diagram DL (for data lines DL1 and DL2 of FIGS. 2, 7 and 10), it is shown during timing cycle READA0,that read data from the memory cells appears on the data lines DL1 and DL2 immediately after the signal DLEQ goes low. Similarly, during timing cycle WRITEA1, write data from the input/output pad transitions all the way up the circuit and appears on the data lines DL1 and DL2 immediately after the signal DLEQ goes low. Thus, regardless of whether a read or write operation is being performed in a given timing cycle, the read or write data will appear on the data lines DL1 and DL2 during the given timing cycle immediately after the signal DLEQ goes low.

The DLEQ clock or a derivative of the DLEQ clock performs the following functions in the case of a write operation: (1) it latches the write control in block 330 of FIG. 11 and holds it into the next cycle; (2) it latches the write data in block 310 of FIG. 11 and holds the data into the next cycle; and (3) it precharges the data lines to allow equal time for new data to transition in the DL lines whether the consecutive data is at the same voltage levels or not. Thus, as described above, this design allows the next read/write operation to be evaluated during an active high DLEQ clock signal, and then performed immediately after the DLEQ clock signal goes low. This enables the circuit to perform random read and write operations without experiencing a cycle time penalty for one or the other. A cycle time penalty would occur if either a read or write operation ran too long and thus prevented the next operation from being performed when it was supposed to. This is a key advantage of the invention in that it allows random read and write operations to be performed without varying cycle time issues.

Another advantage of this invention is that it uses the restore clock signal DLEQ to latch the read/write signal so as to allow the read or write operation to be rolled into the beginning of the next cycle. As illustrated in FIG. 12 for the timing diagram DL (for the data lines DL1 and DL2), for each of the timing periods READA0, WRITEA1, READA2 and READA3, the data remains on the data lines into the next period until the restore clock signal DLEQ goes high. This enables the overall cycle times to be reduced by maximizing the active read/write time and minimizing latching and pipeline stage transfer time. This is in contrast to a system where, for example, the read/write signal was latched at the end of the cycle, which would require the cycle times to be extended to produce the same available data times shown for timing diagram DL in FIG. 12.

Another advantage of this invention as described above is that it uses the read data path as a read/write data path. As described above with reference to FIGS. 1, 4 and 5, the clock signals DCLK and IOEQ control the equalization circuits between the data latch lines DLL1 and DLL2, and the input/output lines IO1 and IO2, respectively. As illustrated with respect to FIGS. 7 and 8, clock signals IOEQ and DCLK are disabled during a write operation so as to allow the lines IO1, IO2, DLL1, and DLL2 to be over-driven with the write data. As illustrated in FIG. 9, and in timing period WRITEA1 of FIG. 12, the over driving of the lines IO1, IO2, DLL1, and DLL2 allows the write data to be quickly transitioned up the lines so that it is available to the data line sense amp 32. As described above, the data is then latched by the data line restore clock signal DLEQ going high, and is applied immediately after the signal DLEQ goes low. Using this process, the lines DL1, DL2, DLL1, DLL2, IO1 and IO2 are used for both read and write operations. This technique thus avoids the need for additional lines that would otherwise be required for write operations and which would consequently require more wiring, more control logic, and greater surface area.

In summary, the key aspects of the invention are that the circuit accomplishes a high performance random read/write SDRAM design by synchronizing the read and write operations at the data line sense amplifier. This enables the design to perform random read and write operations without varying cycle time issues or unbalanced margin issues. The invention also uses the data lines as bi-directional lines to accomplish high performance reads and writes with minimal additional wiring overhead to the logic and wiring already used for the read case. This design enables a single clock timing flow for both reads and writes which is the basis for the balanced margins for reads and writes.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor memory device for storing data, the semiconductor memory device comprising:
    a memory where data signals are stored;
    an input/output port for writing and reading data signals to and from the semiconductor memory device;
    pairs of data lines in series for passing data signals from the memory to the input/output port, the same pairs of data lines that are used during a read operation to pass data signals from the memory to the input/output port also being used during a write operation to pass data signals from the input/output port to the memory;
    a timing logic circuit, the timing logic circuit controlling the timing cycles of when data signals are passed to and from each of the pairs of data lines during the read operation, the timing logic circuit during the write operation disabling all of the timing cycles for all of the pairs of data lines except the pair closest to the memory so that write data may be overdriven onto the pairs of data lines without concern for the normal timing cycles for those data lines, the write data being transferred during the write operation to the pair of data lines closest to the memory for which the timing cycle is still active at approximately the same point during the timing cycle that the read data is transferred during the read operation.

2. The semiconductor memory device of claim 1, further comprising:
    read circuitry coupled between the consecutive pairs of data lines, the read circuitry being used during the read operation to perform amplifying, isolating, latching, or driving functions with regard to the data signals; and
    pairs of bypass lines coupled between the consecutive pairs of data lines for bypassing the read circuitry during the write operation.

3. The semiconductor memory device of claim 2, wherein the read circuitry includes read drivers for driving data signals onto a first pair of data lines during the read operation.

4. The semiconductor memory device of claim 3 further comprising write drivers for driving data signals to a second pair of data lines during the write operation, wherein at least one pair of bypass lines is coupled to a write driver.

5. The semiconductor memory device of claim 2, wherein the read circuitry includes a latch for latching the data signals during the read operation.

6. The semiconductor memory device of claim 5, wherein the read circuitry includes an isolation circuit for isolating the latch from one of the pairs of data lines.

7. The semiconductor memory device of claim 1, further comprising equalization circuits being controlled by equalization signals to reset the voltage on the data lines during each of the timing cycles for the data lines.

8. The memory device of claim 7, wherein the equalization circuits are coupled between each of the data lines in each pair of data lines.

9. The memory device of claim 7, wherein the equalization circuits bring each of the data lines in the respective pairs of data lines to a common mid-level voltage.

10. The semiconductor memory device of claim 7, further comprising read and write data latches coupled to a first pair of data lines for latching data signals on the data lines, the timing for the data latch being controlled such that data is latched by the equalization signal so that the read or write operation is rolled into the beginning of the next timing cycle for the first pair of data lines, so that the active read/write time is increased and the latching time is reduced.

11. The semiconductor memory device of claim 4, wherein the bypass lines coupled to the pair of data lines that is second closest to the memory include a write data latch for latching write data during the write operation.

12. The semiconductor memory device of claim 11, wherein the bypass lines coupled to the pair of data lines that is second closest to the memory include an isolation circuit that couples the write data latch to the pair of data lines that is second closest to the memory.

13. The semiconductor memory device of claim 4, wherein the bypass lines that are coupled to the pair of data lines that is closest to the memory include an isolation circuit for isolating the pair of data lines that is closest to the memory from the write drivers of the bypass lines.

14. A semiconductor memory device for storing data, the semiconductor memory device comprising:

a memory where data signals are stored;

an input/output port for writing and reading data signals to and from the semiconductor memory device;

pairs of data lines in series for passing data signals from the memory to the input/output port, the same pairs of data lines that are used during a read operation to pass data signals from the memory to the input/output port also being used during a write operation to pass data signals from the input/output port to the memory;

read circuitry coupled between at least two pairs of consecutive data lines for performing amplifying, isolating, latching, or driving functions with respect to the data signals;

pairs of bypass lines coupled between pairs of consecutive data lines for selectively bypassing the read circuitry during the write operation; and a write data latch being coupled to at least one of the pairs of bypass lines for latching write data during the write operation.

15. The semiconductor memory device of claim 14, wherein the read circuitry includes read drivers for driving data signals onto a pair of data lines during the read operation.

16. The semiconductor memory device of claim 14, further comprising write drivers for driving data signals to a pair of data lines during the write operation, wherein at least one of the pair of bypass lines is coupled to a write driver.

17. A semiconductor memory device of claim 14, wherein the read circuitry includes a latch for latching the data signals during the read operation.

18. The semiconductor memory device of claim 17, wherein the read circuitry includes an isolation circuit for isolating the latch from one of the pairs of data lines.

19. The semiconductor memory device of claim 14, further comprising equalization circuits being controlled by equalization signals to reset the voltage on the data lines during each of the timing cycles for the data lines.

20. The semiconductor memory device of claim 19, wherein the equalization circuits are coupled between each of the data lines in each pair of data lines.

21. A semiconductor memory device for storing data; the semiconductor memory device comprising:

a memory for storing data signals;

an input/output port for inputting and outputting data signals to and from the semiconductor memory device, the data signals being output from the semiconductor memory device during a read operation and being input into the semiconductor memory device during a write operation;

clock circuitry for generating clock signals for controlling the timing of the read and write operations;

pairs of data lines in series for carrying complementary data signals between the memory and the input/output port of the semiconductor memory device;

a first pair of data lines being coupled closest to the memory and a last pair of data lines being coupled closest to the input/output port, each pair of data lines being controlled by a clock signal that creates a timing cycle for each of the pairs of data lines and which determines when data is generated on each of the pairs of data lines during the read operation;

a control logic circuit for disabling the clock signals for all of the pairs of data lines except the first pair of data lines during the write operation, the clock signals being disabled so that during the write operation all of the pairs of data lines except the first pair of data lines can be overdriven with the write data so that the write data can arrive at the first pair of data lines at approximately the same time during the first pair of data lines timing cycle that read data arrives during a read cycle.

22. A semiconductor memory device of claim 21, further comprising:

read circuitry coupled between the consecutive pairs of data lines comprising amplifiers, latches, drivers, or isolation circuits.

23. The memory device of claim 22, wherein each of the pairs of data lines in which the read circuitry includes a read data latch for latching data during the read cycle are coupled to a pair of bypass lines for bypassing the read data latch during a write cycle.

24. The memory device of claim 23, wherein the read circuitry further includes read drivers that are also bypassed by the bypass lines.

25. The memory device of claim 23, wherein the read circuitry further includes isolation circuits, the isolation circuits also being bypassed by the bypass lines.

26. The memory device of claim 23, wherein the bypass lines are coupled to a write driver for driving write data from one pair of bypass lines to the next pair of bypass lines during the write operation.

* * * * *